United States Patent [19]

Bacchetti et al.

[11] Patent Number: 4,665,315
[45] Date of Patent: May 12, 1987

[54] METHOD AND APPARATUS FOR IN-SITU PLASMA CLEANING OF ELECTRON BEAM OPTICAL SYSTEMS

[75] Inventors: Lawrence F. Bacchetti, Belmont; David M. Walker, Westford; Donald O. Smith, Lexington, all of Mass.

[73] Assignee: Control Data Corporation, Minneapolis, Minn.

[21] Appl. No.: 718,361

[22] Filed: Apr. 1, 1985

[51] Int. Cl.[4] .............................................. H05H 1/00
[52] U.S. Cl. .............................. 250/492.1; 250/492.2; 250/424; 55/117
[58] Field of Search .................... 15/1.5, 300, 301; 55/117, 120; 250/306, 307, 310, 311, 492.21, 492.1, 396 R, 431, 423 R, 424; 313/362.1, 231.31; 315/111.21

[56] References Cited

U.S. PATENT DOCUMENTS

| | | | |
|---|---|---|---|
| 2,985,756 | 5/1961 | Holland | 15/1.5 R |
| 4,344,019 | 8/1982 | Gavin et al. | 250/423 R |
| 4,362,936 | 12/1982 | Hoffman et al. | 250/292 |
| 4,496,843 | 1/1985 | Kirita et al. | 250/426 |

FOREIGN PATENT DOCUMENTS 0106793  8/1979  Japan .............................. 350/111.21

*Primary Examiner*—Bruce C. Anderson
*Assistant Examiner*—Paul A. Guss
*Attorney, Agent, or Firm*—Charles W. Helzer

[57] ABSTRACT

A method and apparatus for in-situ cleaning of charged particle beam optical systems such as electron microscopes, electron beam lithography systems, ion beam microscopes or lithography systems, through the use of a specially introduced plasma forming gas such as hydrogen that is excited by applying a high voltage, high frequency excitation potential between various optical elements of the electron beam optical column. Alternately, specially constructed separate plasma forming electrodes can be built into the electron beam optical system for this purpose. During the cleaning operation the plasma reacts chemically with the contaminants previously formed on the surface of the electron beam column optical elements to form gaseous reactants which then are pumped out of the electron beam column system.

27 Claims, 4 Drawing Figures

EXHAUST

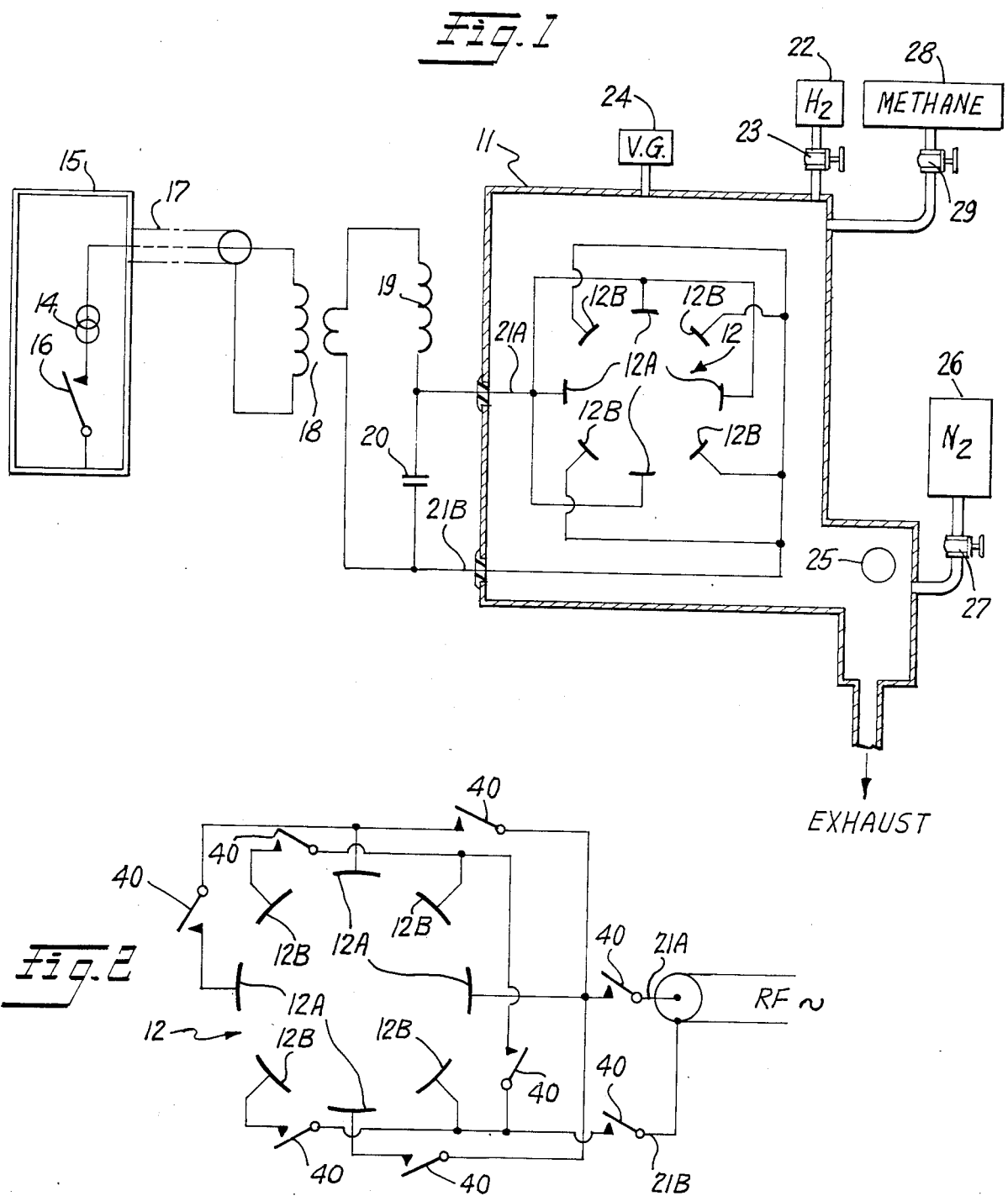
Fig. 1
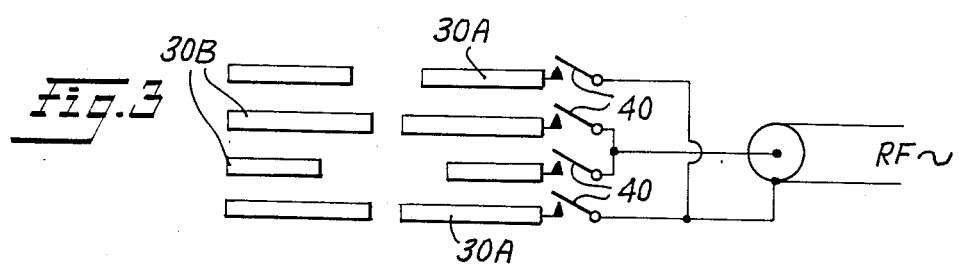
Fig. 2
Fig. 3

METHOD AND APPARATUS FOR IN-SITU PLASMA CLEANING OF ELECTRON BEAM OPTICAL SYSTEMS

FIELD OF INVENTION

This invention relates to in-situ cleaning of contaminants from the surfaces of elements of an electron or ion optical system such as electron microscopes, electron-beam lithography systems, ion beam microscopes and the like.

More specifically, this invention makes available a novel method and apparatus for in-situ cleaning of the optical elements of a charged particle optical system such as the lens, apertures and deflectors which are subject to contamination by the build up of insulating films and which can become electrically charged by stray and scattered charged particles, i.e., electrons or ions, during operation thereby introducing instabilities in the operation of the system.

BACKGROUND PRIOR ART PROBLEM

The build up of insulating films on the elements of an electron beam optical system which become electrically charged by scattered and stray electrons and that then introduce instability in the performance of the electron beam optical system, is quite common in electron microscopes and in electron-beam lithography systems where such contamination occurs for several reasons. The most common reasons are pump contamination, the presence of hydrocarbons as residual gas released from a test specimen and which are polymerized by the electron beam and the release of hydrocarbons from an irradiated organic workpiece, e.g. organic resist materials used on a semiconductor wafer being processed in an electron-beam lithographic system. An additional source of contamination occurs from the formation of metal oxides on the surface of metal lens and deflector elements of the optical system.

Such contamination of the elements of the electron optical system in electron microscopes and electron lithographic systems, and the like presents serious limitations to the use of such instruments. For example, in the past to obviate the effects of such build up of contaminants, elements used in the optical systems had to be designed to be removable for ready cleaning. This complicates the mechanical design as well as resulting in recurring extensive machine down times. In an effort to decrease the rate of contamination and consequent machine down time, some electron beam optical systems have incorporated separate heaters to keep the optical system elements hot and hence inhibit formation of contaminating films. In some instances contamination of lens and deflectors is reduced by using large diameter elements. This latter constraint has resulted in the attempted use of magnetic optical systems instead of electrostatic optical systems in a number of applications. This is due to the fact that large diameter electrostatic lens and deflectors require excessively high voltages for many practical applications.

If small diameter electron beam optical elements could be kept clean readily and economically, then it becomes possible to make minaturized electrostatic electron beam optical columns having a volume many hundreds of times less than the volume of comparable presently used magnetic electron beam columns. One important use of such minaturized electron beam columns is in electron-beam array lithography systems such as that illustrated and described in U.S. Pat. No. 4,390,789 issued June 28, 1983 for an "Electron Beam Array Lithography System Employing Multiple Parallel Array Optics Channels and Method of Operation"—Donald O. Smith and Kenneth J. Harte—inventors and assigned to Control Data Corporation; and U.S. Pat. No. 4,430,571 issued Feb. 7, 1984 for a "Method and Apparatus for Exposing Multi-Level Registered Patterns Interchangeably Between Stations of a Multi-station Electron Beam Array Lithography (EBAL) System"—Donald O. Smith and Kenneth J. Harte—inventors and assigned to Control Data Corporation. There is no known way to build miniaturized electron optics systems such as described in these two patents using magnetic lens and deflectors small enough for the applications for which the systems are intended. Furthermore, even if small magnetic columns could be built, interaction due to the fringing magnetic fields between closely spaced columns as described in these patented systems, would make the miniaturized magnetic electron beam columns unsuitable for such uses. However, the necessity for removing contaminated parts from a working electrostatic electron optical system for cleaning makes the use of electron optics in general, and electrostatic optics in particular, impractical for many applications. This also is true of the electron beam lithographic systems described in the above-cited patents. It would be impractical to design such electron beam lithographic systems (EBAL systems) using readily disassembled and removable electron beam optical system elements due to the prohibitive cost and commercially impractical down times that such removal and cleaning would entail.

SUMMARY OF INVENTION

It is therefor a primary object of the present invention to provide an in-situ cleaning method and apparatus for cleaning contaminated optical elements of charged particle optical systems such as electron microscopes and EBAL systems using a plasma which is induced in an ionizable gaseous atmosphere specifically introduced into the housing of the electron beam system for cleaning purposes. The plasma is produced by applying a high frequency electric potential between various optical elements of the electron beam optical system or to special separate electrode elements built into the electron beam optical system housing for this specific purpose. This in-situ plasma cleaning of the optical system elements can be performed at any time during the lifetime of the electron beam optical system without requiring an extensive down-time of the machine. Hence, if the electron beam optical elements become contaminated during use of the system in the presence of or introduction of organic molecules introduced into the system either as a target specimen or otherwise during normal operation, the elements of the optical system can be easily and routinely cleaned by activating the plasma cleaning procedure and apparatus without requiring mechanical disassembly of the system and with only a short down time interval required for the cleaning.

In practicing the invention, a novel method and apparatus for in-situ cleaning of contaminants from the surfaces of elements of a charged particle optical system supported within a gas-tight housing is provided. The in-situ cleaning is achieved by supplying an ionizable gas into the housing of the optical system and producing a high voltage electrical field between the elements of the optical system to be cleaned and an adjacent electrode. The electrical field is of sufficient magnitude to induce plasma discharge of the ionizable gas adjacent to the elements to be cleaned. By removing reaction products produced by the chemical reaction of the plasma with the contaminants on the surfaces of the elements to be cleaned from the housing, cleaning and removal of the contaminants easily and economically can be accomplished without requiring mechanical disassembly of the constitutent parts of the charged particle optical system. During the cleaning operation, removal of the chemical reaction products is achieved by continuously evacuating the optical system housing with a vacuum pump while simultaneously continuously supplying fresh ionizable gas to the housing. The high voltage electric field preferably is a high frequency alternating electric field that is compatible with radio frequency electromagnetic interference emissions requirements of the F.C.C. In situations where the ionizable gaseous medium does not chemically react with a specific contaminant coating, additional reactant gases capable of such chemical reaction can be introduced into the ionizable atmosphere to facilitate the cleaning process. Preferably the onset of the plasma in the ionizable gaseous atmosphere is monitored so that the plasma can be maintained during the cleaning process for a sufficient period of time to achieve effective cleaning of the optical system elements. For certain applications, it may be desirable to add a neutralizing gas such as nitrogen to the reactant gaseous product being formed in the optical system housing in sufficient quantity during the cleaning process to prevent formation of hazardous combustible gaseous mixtures.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters, and wherein:

FIG. 1 is an overall schematic diagram of a plasma cleaning apparatus for used in carrying out the method of plasma cleaning of the elements of a charged particle optical system in accordance with the present invention;

FIG. 2 is a schematic diagram illustrating an eight-fold coarse deflector element used in an electron beam optical column and shows how a high voltage, high frequency alternating current potential can be applied to alternate sets of deflectors in order to achieve plasma cleaning in the presence of an ionizable gaseous atmosphere in accordance with the invention;

FIG. 3 is a schematic diagram showing the application of a high frequency alternating current potential to alternate ones of a four element electrostatic lens employed in an electron beam optical system for the purpose of plasma cleaning of the lens elements.

BEST MODE OF PRACTICING THE INVENTION

Figure 4:
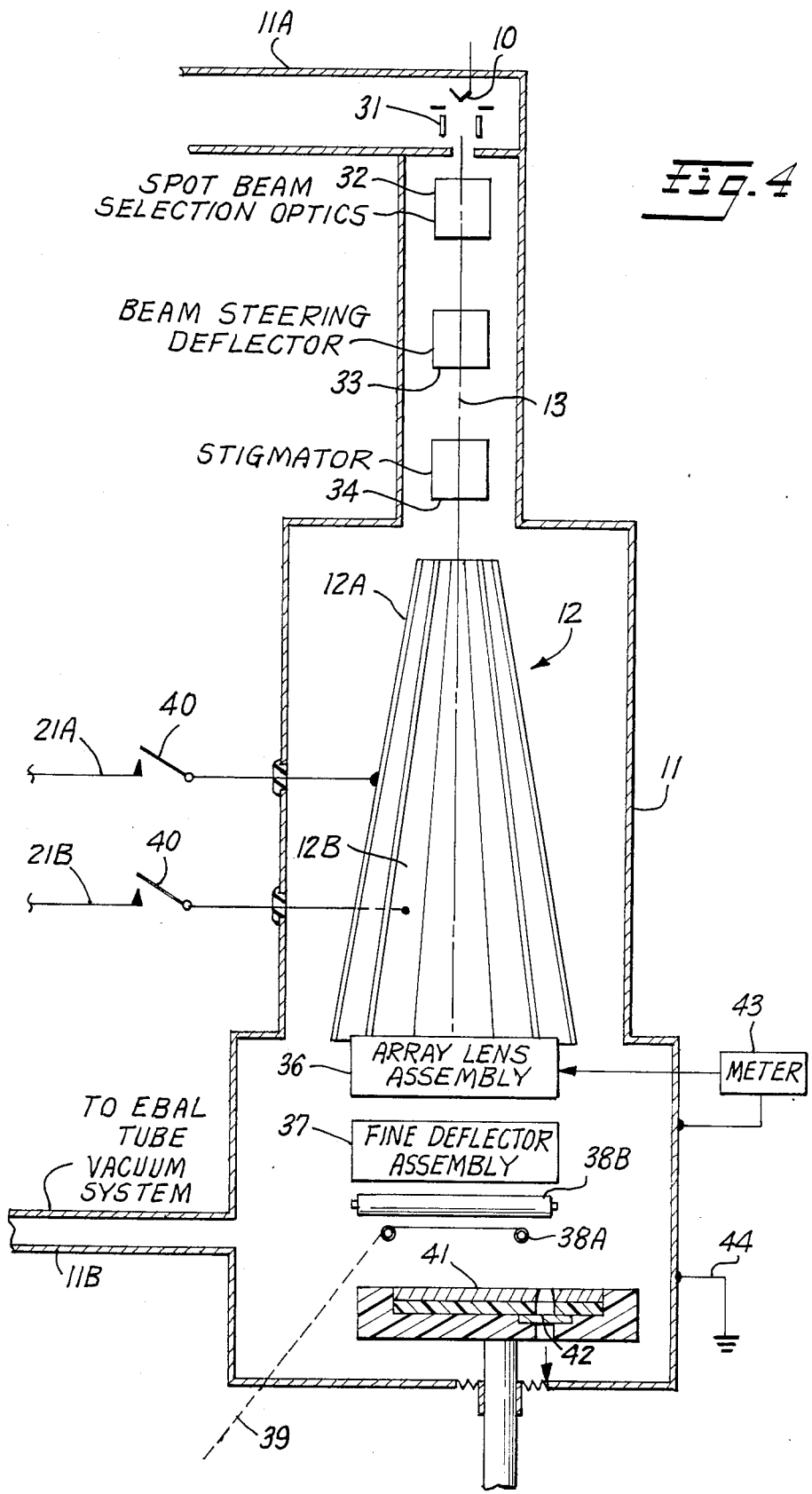
FIG. 4 is a schematic illustration of one suitable technique for monitoring the onset and continuing existence of a plasma for cleaning purposes induced in an ionizable gaseous atmosphere within the housing of an electron beam optical system with the plasma acting on the surfaces of elements of the optical system to be cleaned.

FIG. 1 is a diagramatic sketch illustrating the best known mode of practicing the invention at the time of filing this application. In FIG. 1 a housing 11 which contains an electron beam acessed lithograph apparatus similar to those described in the above-noted U.S. Pat. No. 4,390,789 and U.S. Pat. No. 4,430,571. In FIG. 1 a cross sectional view of the housing 11 is taken through an eight-fold coarse deflector shown generally at 12. The coarse deflector 12 may be of the type described in U.S. Pat. No. 4,142,132 issued Feb. 27, 1979 in the name of Kenneth J. Harte and assigned to the Control Data Corporation. As best shown in FIG. 2, the eight-fold deflector 12 is comprised by an annular array of elongated coarse deflector electrode elements arrayed in two separate interconnected sets 12A and 12B in a concentric ring centered on an electron beam path 13 best seen in FIG. 4 of the drawings. A source of high radio frequency electric potential is shown at 14 supported within a sealed housing 15 and energizable through an on-off switch 16. The high radio frequency source 14 is coupled through a coaxial cable 17 to an impedance matching transformer 18 whose secondary winding is coupled across a series resonant circuit comprised by an inductor 19 and capacitor 20. Capacitor 20 has one of its terminals connected by a conductor 21A to excite the set of interconnected coarse deflector electrodes 12A. The remaining terminal of capacitor 20 is connected by a conductor 21B to the remaining interconnected set of coarse deflector terminals 12B as shown in FIG. 1. A source of hydrogen 22 is connected via an on-off flow control valve 23 in gas-tight housing 11 in which the coarse deflector electrode assembly 12 is physically supported. Housing 11 is evacuated to a very low pressure by means of a vacuum pump 25.

From FIG. 2 it is seen that for best cleaning of the optical system deflector elements it is desirable to interconnect the adjacent deflector elements in two different sets 12A and 12B which are of opposite polarity during excitation. Such interconnection of the separate deflector elements while required for cleaning purposes cannot be maintained during normal operation of the apparatus as an EBAL system since it is imperative that each deflector element of the overall coarse deflector subassembly have its electric excitation potential independently controlled as explained more fully in the above-referenced U.S. Pat. No. 4,142,132 to Harte.

In order to allow for independent electric excitation of the individual deflector elements during normal operation of the EBAL system, the interconnecting circuitry required for cleaning must be provided with suitable switching devices such as shown at 40 for electrically isolating the individual deflector elements during normal operation of the charged particle beam apparatus. For example, the switching devices 40 could comprise semiconductor gating devices of conventional construction mounted exteriorly of housing 11 for easy access and operation to achieve the desired interconnection of the several deflector elements into the two opposed sets 12A and 12B upon inception of a cleaning operation, and for electrically isolating the elements with respect to each other during normal operation. It is understood that the necessary sources of excitation potential and their connections to the respective deflector elements for use in normal operation of the apparatus have not been shown for the sake of simplicity. Such interconnections and sources are disclosed fully in the above referenced prior art patents.

When it is desired to institute a cleaning operation due to build-up of contaminants on the surfaces of the sets of deflector electrode elements 12A and 12B, for example, the EBAL apparatus, or some other similar charged particle optical system such as that shown schematically in FIG. 4, is shut down from its normal operating condition as an EBAL system and the cleaning procedure instituted. This is done by supplying an ionizable gas such as hydrogen from the source 22 through valve 23 to the interior of the EBAL housing 11. The switches 40 are then actuated to interconnect the deflector electrodes into opposed sets 12A and 12B energizing RF applied to the respective opposed sets 12A and 12B and source 14 through on-off control switch 16 to supply high frequency, high voltage excitation potential across the two sets of interconnected delfector electrode elements 12A and 12B as best seen in FIG. 2 of the drawings. It should be noted at this point in the description that because of the alternating nature of the high frequency excitation potential, first one set of electrodes, such as 12A for example, will operate as cathodes while the opposing set of deflector electrodes 12B act as anodes and during alternate half cycles of the applied high frequency potential, the reverse situation is true. The existence of the high electric potential between sets of spaced apart deflector electrode elements will induce a plasma discharge between the electrodes in the presence of the ionizable hydrogen gas. This plasma discharge, sometimes referred to as cathode luminescence, will exist and appear as though continuously present on all the electrode surfaces due to the high frequency nature of the high voltage excitation potential. The existence of the plasma discharge at the surfaces of the respective deflector electrode elements 12A and 12B will volatilize the contaminants on these surfaces in a plasma induced chemical reaction whose products are swept out of the housing 11 by continuous evacuation through pump 25 and exhausted to the atmosphere In order to assure that the reactant products do not result in the production of a hazardous combustible gaseous mixture, neutralizing gas such as nitrogen may be introduced into housing 11 from a source 26 via an on-off flow control valve 27. During operation, the pressure of the ionizable gas within the gas-tight housing 11 is controlled by varying the supply of hydrogen from source 22 via valve 23 and the speed of evacuation of vacuum pump 25. The pressure of the gas within the housing is monitored by the vacuum gauge 24 which preferably is of a type that measures pressure independently of the gaseous species within housing 11.

If the elements of the charged particle optical column being cleaned are fabricated from oxidizable metal materials, then oxygen would be a poor choice as a plasma cleaning gas since non-volatile metal oxide can be expected to be formed on the surfaces of the element. However, in the case of hydrogen, it is known that hydrogen plasma alone does not remove metal oxide films at temperatures under 200 degrees Centigrade even in the presence of a plasma. For these situations, the addition of a few percent of an additional reactant gas such as methane applied from a source 28 via an on-off flow control valve 29 into the housing 11 along with the ionizable hydrogen gas, would be sufficient to remove such oxides since methane is known to chemically react with such metal oxides in the presence of a plasma.

From the foregoing brief description, it will be appreciated that there are essentially three major problem areas to be resolved in designing a suitable in-situ plasma cleaning system according to the invention. The first problem area concerns selection of a suitable ionizable gas, the pressure at which the gas is maintained within the housing 11 and the flow rate of the reactant products out of the housing. The second problem area is the voltage at which a suitable plasma can be maintained within the ionizable gaseous atmosphere in housing 11 including its frequency, and the nature of the electrode system. The third problem is to provide electrodes across which to apply the voltage. While it is preferred to use the electrode elements being cleaned themselves as shown in FIGS. 2 and 3 of the drawings, for certain types of equipment it may be necessary to insert specially built electrodes for cleaning purposes which are so designed as not to interfere with the normal operation of the electron beam optical system, but which can be activated if necessary during the cleaning operation. However, the preferred electrodes for the application of the voltage are the optical elements themselves. This provides simplicity since no new hardware needs to be introduced into the system for in-situ cleaning purposes and also the plasma produced is applied selectively and exactly to the surfaces desired to be cleaned.

The above considerations are best illustrated in FIG. 2 which essentially is an enlarged view of the coarse deflector system shown schematically in FIG. 1 and clearly illustrates how adjacent coarse electrode deflector members are supplied with opposite polarity RF high voltage potential to achieve plasma breakdown of the ionizable gaseous atmosphere within the gas-tight housing of an electron beam system. FIG. 3 of the drawings illustrates the manner in which the elements of a lens assembly employed in an electron beam optical system can be interconnected to a suitable radio frequency source whereby each circular centrally apertured lens element such as 30A is adjacent to a spaced-apart lens element such as 30B with the central aperture of all of the lens elements being coaxially aligned. In a manner similar to the FIG. 2 illustration upon application of a high radio frequency potential as shown in FIG. 3, one set of the lens elements 30A will be positive while the opposed adjacent sets 30B are negative and vice versa during each RF cycle. Because of the high frequency of the excitation potential, plasma discharge induced in the ionizable gaseous atmosphere surrounding the lens elements will exist and appear as though each surface is continuously excited with the plasma to achieve the desired cleaning action as described earlier. It should be noted at this point in the description that the wiring configurations illustrated in FIGS. 1, 2 and 3 are exemplary only and are not the only ones which could be employed in practicing the invention. This is particularly so with respect to certain designs where it would be necessary to employ an additional specially designed electrode to achieve plasma formation around a given element of the electron beam optical system. However, it is believed that other wiring configurations and electroding arrangements will be obvious to those skilled in the art in the light of the teachings of the present disclosure.

The choice of ionizable gas used in practicing the in-situ cleaning method is determined by two major factors. First the ionizable gas must react chemically with the organic contaminant to be removed from the surfaces of the elements of the electron beam optical system to be cleaned and to form gaseous reactants which can be pumped out of the housing 11 by the vacuum pump 25. The second important characteristic is that the ionizable gas must not sputter excessive amounts of metal from the electrode elements onto the insulating supports for the elements which are being cleaned. Sputtered metal can be redeposited on insulating parts that are used to provide voltage stand-off between the various optical elements of the electron beam optical system. The gas which most completely satisfies these criteria is hydrogen. Ionized atomic hydrogen scissors saturated hydrocarbon molecules which normally are the contaminants built-up on the elements to be cleaned and form low molecular weight hydrocarbon ions and radicals which are pumped away via vacuum pump 25. The sputtering yield is proportional to the mass of the sputtering ion and hydrogen is the lightest of all possible ions. Consequently, by the use of hydrogen, sputtering is reduced to a minimum. Oxygen also is possible for use as an ionizable gas since hydrocarbon contamination will chemically react with oxygen in the presence of a plasma. However, since an oxygen ion is sixteen times heavier than a hydrogen ion, sputtering will be greater.

As noted earlier, if oxidizable optical elements are present, then oxygen would be a poor choice as a plasma cleaning gas since non-volatile metal oxides can be expected to be formed on the elements by the ionizable oxygen gas. In the case of hydrogen it is known that hydrogen plasma alone does not remove metal oxide films at a temperature under 200 degrees Centigrade. However, the addition of a few percent of methane to the hydrogen will remove such oxide contaminants and hence this is the proper ionizable gaseous mixture to use for removal of oxidizable metal surfaces formed on optical system elements to be cleaned.

The gas pressure of the ionizable gaseous atmosphere within housing 11 is best chosen experimentally by varying the pressure at a constant RF frequency excitation voltage and observing the onset of a stable plasma glow surrounding the elements to be cleaned. Proper conditions of pressure and voltage are highly dependent on the geometery of the element which is to be cleaned. It has been determined experimentally that because of the variations imposed by geometry of the elements, pressure can vary between one milli Torr up to ten Torrs for optimum cleaning results.

It is apparent from the foregoing description that in order to remove the volatilized contaminants in the cleaning process, a gas flow through the housing 11 is preferred. This is accomplished by controlling the ionizable gas inlet via valves 23 and 29 and the speed of evacuation of housing 11 via vacuum pump 25 during cleaning.

The use of direct current excitation voltages are found to be undesirable due to the production of local arcing observed to occur as a result of the high DC fields which appear across the contaminant insulating films. The use of high radio frequency avoids this problem since the capacitance of the film presents low impedance to the high radio frequency voltage. The exact high radio frequency is not critical and can be chosen to be in accord with FCC regulations to minimize electromagnetic interference emissions, and to facilitate impedance matching.

Since in most practical situations the plasma produced within the gas-tight housing 11 cannot directly be observed, it is important to provide some means for monitoring the onset and continuing presence of the plasma within housing 11 during the in-situ cleaning period. This can best be done by monitoring the high radio frequency voltage induced on a separate high impedance probe which is not being cleaned in the vicinity of the desired plasma cleaning action. A preferred way for accomplishing this is by simply providing an electrode that is not being cleaned and connecting it to a suitable voltmeter such as an oscilliscope which can be read outside of housing 11. When the plasma ignites a direct current voltage shift will appear across the monitoring electrode. By this means the onset of the plasma and the length of time that the plasma is ignited and present in the housing 11 and achieving cleaning action on the elements to be cleaned can be monitored to assure sufficient cleaning time to achieve adequate cleaning of the elements.

While it is of course possible to provide separate monitoring probes within the electron beam optical system housing 11 to provide the required monitoring described in the preceeding paragraph, a preferred approach is to use existing adjacent optical system elements which are not being directly excited. This technique is illustrated in FIG. 4 of the drawings which is a longitudinal sectional view of an exemplary electron beam optical system employed for electron beam accessed lithography (EBAL). The EBAL system shown in FIG. 4 is comprised by a cathode 10 mounted at one end of the gas-tight housing 11 with the source of ionizable gas 22 and 28 being supplied to the interior housing via inlet 11A and the vacuum pump 25 withdrawing the contaminant reaction products via the exhaust end 11B of housing 11. Cathode 10 comprises part of an electron gun which produces electron beam 13 that first passes through a set of blanking electrodes 31 positioned to deflect electron beam 13 off an aperture onto an opaque plate for cutting off or blanking the beam from reaching the target being treated at selected times. After passing the blanking electrode 31, beam 13 passes through a beam spot size selection optical system 32 for determining the size and shape of the electron beam spot. The beam then passes through a beam steering deflector 33 for aligning the electron beam with the axis of the coarse deflector 12. Coarse deflector 12 deflects beam 13 to the entrance of a particular lenslet in an array lens assembly 36 after the beam has passed through a stigmator 34 for correcting any astigmatism which might be introduced by fine deflector array 37 through which the beam passes after passing through the array lens assembly 36 and before impinging upon a target 41 supported in a movable target holder assembly 42. A lenslet stopping aperture sub-assembly is provided by a set of rolls 38B and 38A which are actuated through a mechanical interconnection shown at 39 to control operation of the lenslet stopping aperture sub-assembly. By this means selective impingment of the electron beam 13 upon a micro-sized spot on the target surface 41 can be achieved. It is assumed that the coarse deflector element 12A and 12B as described earlier with relation to FIGS. 1 and 2 are to be cleaned. For this purpose, suitable electrically interconnections shown at 21A and 21B via gate switches 40 will have been provided to the two sets of opposed coarse deflector electrode elements 12A and 12B for application of the high voltage high radio frequency excitation potential.

In order to monitor the onset of the plasma upon application of the excitation potential to the opposed sets of coarse deflector electrodes 12A and 12B in the presence of ionizable gas within housing 11, a suitable voltmeter instrument 43 which may be comprised of an oscilloscope has one input terminal connected to an adjacent sub-assembly of the electron beam optical system, such as the array lens assembly 36, immediately adjacent the coarse deflector 12 measured along the longitudinal axis of the electron beam path 13. The remaining input to meter 43 is connected to the housing 11 which is grounded as shown at 44. By this arrangement, upon the occurrance of the plasma within the housing 11 portion in which coarse deflector 12 is mounted, a sharp shift in DC voltage will be sensed by meter 43 due to coupling to the unexcited array lens assembly 36 via the plasma. By this arrangement, no extra hardware is required in order to provide an additional probe for measuring or sensing the onset of the plasma and its continuing presence.

While in the arrangement shown in FIG. 4 only the array lens assembly 36 is employed as a sensing electrode for monitoring the plasma, it is believed obvious that the meter could just as well have been connected to the stigmator 34 as well as to the array lens assembly 36 due to the longitudinal extent of the deflector elements 12A being cleaned. Similarly, if it is an array lens assembly 36 to be cleaned, then the non-excited fine deflector assembly 37 could be used as a monitoring electrode or alternatively the deflector lens assembly 12. In this manner, accurate observation of the occurrance and duration of the plasma can be obtained.

Alternate methods of detection also could be used such as monitoring the input power versus pressure within housing 11 or alternatively monitoring the ratio of forward and reflected power using elements which are being excited to be cleaned and elements which are non-excited as is known in radio frequency power technology. In such an arrangement detection of second or higher order harmonics in the reflected RF power caused by the nonlinear plasma electrical characteristics would reveal the onset and continuing occurrence of the plasma. Additionally, optical sensors such as silicon photodiodes could be mounted internally of housing 11 in a position to view light generated by the plasma discharge, but of course would be mounted outside the plasma. In this manner, the time-power product required for sufficient cleaning can be monitored. After thus monitoring the cleaning operation and determining that sufficient cleaning has been provided, the electron optical system then could be tested to determine the positional stability of the electron beam while being operated in its normal manner to confirm the fact that adequate cleaning has been performed. Because the in-situ cleaning has been achieved without requiring breakdown and disassembly of the electron beam column, such actual testing of the electron beam positional stability readily is achieved and the instrument placed back in operation with minimum effort and down-time.

From the foregoing description, it will be appreciated that the invention provides a method and apparatus for in-situ cleaning of continuously pumped charged particle optical systems through the use of a specially introduced plasma forming gas such as hydrogen that is excited by applying a high voltage, high frequency excitation potential between various optical elements (or specially introduced electrodes) of the electron beam optical system. During operation, the plasma reacts chemically with contaminants previously formed on the surfaces of elements of the electron beam optical system to form gaseous reactants which then are pumped out of the electron beam optical system housing.

INDUSTRIAL APPLICABILITY

The invention provides a novel in-situ cleaning method and apparatus for use with charged particle optical systems, such as electron microscopes and electron beam lithography systems, wherein the elements of the electron beam optical system, such as lens, apertures and deflectors which are subject to contamination by build-up of insulating film, readily can be cleaned with minimum expenditure of effort and down time of the machine.

Having described several embodiments of a method and apparatus for in-situ plasma cleaning of charged particle optical systems according to the invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. The method of in-situ cleaning of contaminants from the surfaces of the deflector, lens, aperture and other elements of a charged particle optical system including a source of charged particles, deflector lens and aperture elements supported within a gas-tight housing in optical alignment which comprises introducing an ionizable gas into the housing of the optical system, producing a high voltage high frequency alternating electric field between the elements of the optical system to be cleaned and an adjacent electrode member of sufficient magnitude to induce plasma discharge of the ionizable gaseous atmosphere adjacent to the elements to be cleaned, and removing reaction products produced by chemical reaction of the plasma at the surfaces of the elements to be cleaned from the housing.

2. The method according to claim 1 wherein the optical system housing continuously is supplied with fresh ionizable gas and pumped to remove the chemical reaction products produced by the plasma during the cleaning operation.

3. The method according to claim 1 wherein the ionizable gas reacts chemically with the contaminants on the surfaces of the optical system elements to be cleaned in the presence of the plasma and produces minimum sputtering at the surface of the optical system elements.

4. The method according to claim 2 wherein the ionizable gas reacts chemically with the contaminants on the surfaces of the optical system elements to be cleaned in the presence of the plasma and produces minimum sputtering at the surface of the optical system elements.

5. The method according to claim 1 wherein the high voltage alternating electric field is at a high frequency compatible with radio frequency electromagnetic interference emission standards.

6. The method according to claim 4 wherein the high voltage alternating electric field is at a high frequency compatible with radio frequency electromagnetic interference emission standards.

7. The method according to claim 1 further including adding at least one additional reactant gas component capable of chemically reacting with specific contaminant coatings on the surfaces of the optical system elements which otherwise would not chemically react with the ionizable gas alone in the presence of the plasma.

8. The method according to claim 6 further including adding at least one additional reactant gas component capable of chemically reacting with specific contaminant coatings on the surfaces of the optical system elements which otherwise would not chemically react with the ionizable gas alone in the presence of the plasma.

9. The method according to claim 1 further including monitoring the cleaning process to determine the time of formation of a plasma in the ionizable gaseous atmosphere and for maintaining the plasma during the cleaning process for a sufficient period of time to achieve effective cleaning of the optical system elements.

10. The method according to claim 8 further including monitoring the cleaning process to determine the time of formation of a plasma in the ionizable gaseous atmosphere and for maintaining the plasma during the cleaning process for a sufficient period of time to achieve effective cleaning of the optical system elements.

11. The method according to claim 1 further including adding a neutralizing gas such as nitrogen to the reactant gaseous products being formed in the optical system housing during the cleaning process to thereby prevent formation of hazardous combustible gaseous mixtures.

12. The method according to claim 10 further including adding a neutralizing gas such as nitrogen to the reactant gaseous products being formed in the optical system housing during the cleaning process to thereby prevent formation of hazardous combustible gaseous mixtures.

13. The method according to claim 12 wherein the ionizable gas is selected from the class consisting essentially of either hydrogen or oxygen dependent upon the nature of the material from which the optical system elements to be cleaned are fabricated, the gaseous atmosphere within the optical system housing is maintained at a pressure within the range of one milli Torr to ten Torrs, the electrodes for application of the high frequency, high voltage electric field are the optical system elements themselves and monitoring is achieved by a high impedance probe that itself does not require cleaning at the time and present in the housing in the vicinity of the plasma, said probe being connected to a suitable voltmeter.

14. Apparatus for in-situ cleaning of contaminants from the surfaces of the deflector, lens, aperture and other elements of a charged particle optical system including a source of charged particles, deflector, lens, aperture and other elements supported within a gastight housing in optical alignment, means for supplying an ionizable gas into the housing of the optical system, means for producing a high voltage high frequency alternating electric field between the elements of the optical system to be cleaned and an adjacent electrode, said alternating electric field being of sufficient magnitude and frequency to induce plasma discharge of the ionizable gas adjacent to the elements to be cleaned, and means for removing reaction products produced by chemical reaction of the plasma at the surfaces of the elements to be cleaned from the housing.

15. Apparatus according to claim 14 wherein the means for removing the reaction products comprises means for continuously evacuating by pumping the optical system housing and further including means for continuously supplying fresh ionizable gas to the housing during the cleaning operation.

16. Apparatus according to claim 14 wherein the ionizable gas reacts chemically with the contaminants on the surfaces of the elements to be cleaned in the presence of the plasma with minimum occurrence of sputtering at the surfaces of the elements being cleaned during the process.

17. Apparatus according to claim 15 wherein the ionizable gas reacts chemically with the contaminants on the surfaces of the elements to be cleaned in the presence of the plasma with minimum occurrence of sputtering at the surfaces of the elements being cleaned during the process.

18. Apparatus according to claim 14 wherein the means for producing a high voltage electric field provides a high frequency alternating electric field that is compatible with radio frequency electromagnetic interference emission standards.

19. Apparatus according to claim 17 wherein the means for producing a high voltage electric field provides a high frequency alternating electric field that is compatible with radio frequency electromagnetic interference emission standards.

20. Apparatus according to claim 14 further including means for adding at least one additional reactant gas component capable of chemically reacting with specific contaminant coatings on the surfaces of the optical system elements which otherwise would not chemically react with the ionizable gas alone in the presence of the plasma.

21. Apparatus according to claim 19 further including means for adding at least one additional reactant gas component capable of chemically reacting with specific contaminant coatings on the surfaces of the optical system elements which otherwise would not chemically react with the ionizable gas alone in the presence of the plasma.

22. Apparatus according to claim 14 further including means for monitoring the cleaning process to determine the time of formation of the plasma in the ionizable gaseous atmosphere and for maintaining the plasma during the cleaning process for a sufficient period of time to achieve effective cleaning of the optical system elements.

23. Apparatus according to claim 21 further including means for monitoring the cleaning process to determine the time of formation of the plasma in the ionizable gaseous atmosphere and for maintaining the plasma during the cleaning process for a sufficient period of time to achieve effective cleaning of the optical system elements.

24. Apparatus according to claim 14 further including means for adding a neutralizing gas such as nitrogen to the reactant gaseous products being formed in the optical system housing in sufficient quantity during the cleaning process to thereby prevent formation of hazardous combustible gaseous mixtures.

25. Apparatus according to claim 23 further including means for adding a neutralizing gas such as nitrogen to the reactant gaseous products being formed in the optical system housing in sufficient quantity during the cleaning process to thereby prevent formation of hazardous combustible gaseous mixtures.

26. Apparatus according to claim 14 wherein the ionizable gas is selected from the class consisting essentially of either hydrogen or oxygen dependent upon the nature of the material from which the optical system elements to be cleaned are fabricated, the gaseous atmosphere within the optical system housing is maintained at a pressure within the range of one milli Torr to ten Torrs, the electrodes for application of the high frequency, high voltage electric field are the optical system elements themselves and monitoring is achieved by a high impedance probe that itself does not require cleaning at the time and present in the housing in the vicinity of the plasma, said probe being connected to a suitable voltmeter.

27. Apparatus according to claim 25 wherein the ionizable gas is selected from the class consisting essentially of either hydrogen or oxygen dependent upon the nature of the material from which the optical system elements to be cleaned are fabricated, the gaseous atmosphere within the optical system housing is maintained at a pressure within the range of one milli Torr to ten Torrs, the electrodes for application of the high frequency, high voltage electric field are the optical system elements themselves and monitoring is achieved by a high impedance probe that itself does not require cleaning at the time and present in the housing in the vicinity of the plasma, said probe being connected to a suitable voltmeter.

* * * * *